(12) United States Patent
Schon

(10) Patent No.: US 11,859,912 B2
(45) Date of Patent: Jan. 2, 2024

(54) MICROELECTRONICS COOLING SYSTEM

(71) Applicant: Steven Schon, Stafford, PA (US)

(72) Inventor: Steven Schon, Stafford, PA (US)

(73) Assignee: QCIP Holdings, LLC, Strafford, PA (US)

( * ) Notice: Subject to any disclaimer, the term of this patent is extended or adjusted under 35 U.S.C. 154(b) by 0 days.

(21) Appl. No.: 17/336,126

(22) Filed: Jun. 1, 2021

(65) Prior Publication Data

US 2022/0136780 A1     May 5, 2022

Related U.S. Application Data

(63) Continuation of application No. 15/636,377, filed on Jun. 28, 2017, now abandoned, which is a continuation of application No. 12/459,391, filed on Jun. 30, 2009, now abandoned, which is a continuation-in-part of application No. PCT/US2008/014081, filed on Dec. 26, 2008, and a continuation-in-part of application No. 12/291,544, filed on Nov. 10, 2008, now Pat. No. 9,157,687.

(60) Provisional application No. 61/017,198, filed on Dec. 28, 2007.

(51) Int. Cl.
    *H02S 40/44*     (2014.01)
    *F28D 15/04*     (2006.01)
    *F24S 10/95*     (2018.01)
    *F24S 23/74*     (2018.01)
    *F28D 15/02*     (2006.01)

(52) U.S. Cl.
CPC ............ *F28D 15/043* (2013.01); *F24S 10/95* (2018.05); *F24S 23/74* (2018.05); *H02S 40/44* (2014.12); *F28D 2015/0225* (2013.01); *Y02B 10/20* (2013.01); *Y02B 10/70* (2013.01); *Y02E 10/40* (2013.01); *Y02E 10/46* (2013.01); *Y02E 10/60* (2013.01)

(58) Field of Classification Search
CPC ....................... F28D 2015/0225; F28D 15/043
See application file for complete search history.

(56) References Cited

U.S. PATENT DOCUMENTS

| | | | | |
|---|---|---|---|---|
| 7,011,146 | B2 * | 3/2006 | Wong ..................... | F28D 15/043 165/104.33 |
| 7,150,312 | B2 * | 12/2006 | Parish, IV .......... | F28D 15/0233 257/E23.099 |
| 8,047,268 | B1 * | 11/2011 | Kroliczek ............. | F28D 15/046 165/274 |
| 2003/0136548 | A1 * | 7/2003 | Parish ................... | H01L 23/427 257/E23.099 |
| 2005/0081552 | A1 * | 4/2005 | Nilson .................. | F28D 15/043 62/311 |
| 2005/0274120 | A1 * | 12/2005 | Quisenberry ....... | F28D 15/0233 257/E23.098 |

\* cited by examiner

*Primary Examiner* — Filip Zec

(74) *Attorney, Agent, or Firm* — Kristofer E. Elbing

(57) ABSTRACT

In one general aspect, a microelectronics cooling device can include a microchannel heat exchanger within an enclosure that houses the device at a heat absorbing end and another heat exchanger which is optionally also a microchannel heat exchanger at a heat sink end outside the enclosure. One or more pipes flowably connect the two ends for transporting liquid working fluid to the heat absorber and vaporized working fluid to the heat sink. The heat pipes may also be used to transfer heat outside a room that contains the electronic devices.

25 Claims, 12 Drawing Sheets

MICROELECTRONICS COOLING SYSTEM

CROSS REFERENCE TO RELATED APPLICATIONS

This application is a continuation of U.S. Ser. No. 15/636, 377, filed Jun. 28, 2017, which is a continuation of United States Ser. No. 12/459,391 filed Jun. 30, 2009, which is a continuation-in-part of U.S. Ser. No. 12/291,544 filed Nov. 10, 2008, and is a continuation-in-part of PCT application number PCT/US2008/14081, filed Dec. 26, 2008. This application also claims the benefit under 35 U.S.C. 119(e) of U.S. provisional application Ser. No. 61/017,198 filed Dec. 28, 2007. All of these applications are herein incorporated by reference.

FIELD OF THE INVENTION

This application relates to cooling systems for microelectronics, including cooling systems for microelectronics that include microchannels.

BACKGROUND OF THE INVENTION

Microelectronic devices can generate significant amounts of heat in the course of their operation. The generated heat needs to be removed and dissipated, to prevent a catastrophic rise in operating temperature, which can impair the proper functioning of the devices, or even damage the electronic components. Conventionally, cooling devices attached to the heat-generating electronic components can dissipate the heat to the air in the immediate vicinity, e.g. within the enclosure, or exhaust to the room in which the electronics are housed. This, in turn, employs secondary means of removing the heat to an external heat sink, to prevent overheating of the air in the vicinity of the electronics, which can impede the cooling of the electronics. Often, such secondary means of cooling are mechanically complex and energy-intensive systems such as air conditioning or pumped liquid systems.

Heat pipes are used for cooling and transferring heat away from hot objects to a physically separated cooler area or cooling device. Heat pipes may take the form of a single closed tube, or of a pair of tubes or pipes connected in a closed circuit. The full heat pipe system also includes a volatile "working fluid" enclosed in the heat pipe, the evaporation and condensation of which mediates heat transfer from one end of the heat pipe to the other. One end of the tube or closed piping circuit is provided with a means for collecting and absorbing heat (heat absorber) at an elevated temperature, causing the fluid to evaporate. The other end of the tube or piping circuit is provided with a means for rejecting heat (heat sink) at a lower temperature than the hot end. At the heat absorber, the volatile fluid evaporates and absorbs heat; the vapor expands in volume and travels to the heat sink, where it condenses and gives up its heat. The condensed fluid returns to the hot end by gravity or capillary action via a wick, repeating the cycle. The pressure inside the heat pipe rises to that corresponding to the vapor pressure of the working fluid at the fluid boiling temperature inside the heat absorber block.

In a single tube heat pipe, the vapor travels up the core of the tube, and the liquid returns counter-currently along the walls. In a two-pipe configuration, sometimes referred to a thermosyphon, the vapor travels up one pipe, and the liquid returns via the second pipe, which is usually smaller in diameter. Heat pipes have the advantage of very high heat transfer rates, and do not rely on any mechanically moving parts.

An essential consideration in designing heat pipes is the selection of the heat exchangers for the heat absorber and the heat sink. Their characteristics determine the rate at which heat can be transferred away from hot objects or fluids. The rate of heat transfer into the heat absorber, and/or the rate of heat transfer from the heat sink to the cooling medium, is often the limiting factor in the performance of heat pipes, especially if the ratio of the fluid internal surface area to the working fluid volume is relatively small in the absorber or the heat sink Primary considerations in selecting a heat absorber or heat sink configuration are the mechanical design of the heat transfer surfaces (e.g., configuration, material layout and thickness, orientation, etc.), the modes of heat transfer (e.g., conduction and/or convection and/or radiation), and the physical properties (especially the thermal conductivity) of the materials of construction of the heat transfer materials in direct with the working fluid.

Heat pipes have hitherto typically used simple, conventional heat exchange designs for the heat absorber and the heat sink. These include hollow blocks or plates (with a cavity for the working fluid), shell-and-tube exchangers, plate heat exchangers, bare tubes or pipes, and tubes, pipes, or hollow blocks with extended surfaces. However, despite the variety of available configurations, there has still been a need for heat pipes with higher heat transfer rates than those traditionally available.

SUMMARY OF THE INVENTION

In one general aspect, the invention features a method of cooling an electronic device housed inside an enclosure, that includes a microchannel heat absorber located proximate a microelectronic device within the electronic device enclosure and comprising at least one layer defining a plurality of microchannels having a cross-sectional dimension of less than 1000 microns and terminating at a first end thereof in a cool side manifold and at a second end thereof in a warm side manifold. The microchannels are adapted to contain a liquid working fluid that absorbs heat from the microelectronic device and forms a vapor upon flowing therethrough from the first end to the second end. The system also includes a heat sink located outside of the enclosure for receiving and condensing the vapor to reform the liquid working fluid and for discharging the liquid working fluid, and one or more pipes flowably connecting the warm side manifold of the heat absorber to the heat sink and flowably connecting the cool side manifold of the heat absorber to the heat sink. The one or more pipes are connected so as to permit simultaneous flow of the vapor from the heat absorber to the heat sink and of the liquid working fluid from the heat sink to the heat absorber when heat is applied to the heat absorber.

In preferred embodiments, the heat sink can be installed outside of a room housing the electronic device enclosure. The heat sink can be installed in a cooling duct that flows to a location outside of a room housing the electronic device enclosure, with a cooling medium flowing through the duct including air or water. The one or more pipes can comprise only a single pipe or a first pipe flowably connecting the warm side manifold of the heat absorber to the heat sink and a second pipe flowably connecting the cool side manifold of the heat absorber to the heat sink. The single pipe can comprise a porous coaxial wick. The single pipe can comprise an annular band of a porous wicking material. The heat sink can be a microchannel heat sink. The microchannels can be substantially rectangular channels, with the cross-sectional dimension of the microchannels being a shorter of two different cross-sectional dimensions for the microchannels, and with the shorter cross-sectional dimensions being aligned perpendicular to a surface of a heat source. The microchannel heat absorber can be a parallel flow microchannel heat absorber. The microchannel heat absorber can be a cross-flow microchannel heat absorber. The thermal conductivity of material in the layer that defines the microchannels can be greater than 170 watts/m-° C. and the microchannels can have a largest cross-sectional dimension of less than 250 microns. The heat pipe can be entirely passive.

In another general aspect, the invention features a method of cooling a microelectronic device housed inside an enclosure that includes providing a microchannel heat absorber comprising at least one layer defining a plurality of microchannels having a cross-sectional dimension of less than 1000 microns and terminating at a first end thereof in a cool side manifold and at a second end thereof in a warm side manifold, the microchannels containing a liquid working fluid that absorbs heat and forms a vapor upon flowing therethrough from the first end to the second end, a heat sink for receiving and condensing the vapor to reform the liquid working fluid and for discharging the liquid working fluid, and one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber. The method also includes the steps of installing the microchannel heat absorber inside the enclosure, and installing the heat sink outside the enclosure.

In preferred embodiments, the step of providing can provide a heat sink that is installed outside of a room housing the electronic device enclosure or in a cooling duct that flows to a location outside of the room, with the cooling medium flowing through the duct being air or water. The step of providing can provide the layer that defines the microchannels with a thermal conductivity that is greater than 170 watts/m-° C. and the microchannels can have a largest cross-sectional dimension of less than 250 microns. The step of providing can provide an entirely passive microelectronics cooling system.

In a further general aspect, the invention features a method of cooling a microelectronic device housed inside an enclosure that includes causing a liquid working fluid to flow through a plurality of microchannels that are proximate the microelectronic device within a microelectronic device enclosure and having a cross-sectional dimension to the center of the channel that is about equal to or less than the thermal boundary layer thickness for a working fluid. The method also includes causing at least some of the working fluid to form a vapor and absorb heat from the microelectronic device, receiving and condensing the working fluid vapor to discharge heat from the fluid outside the enclosure and reform the liquid working fluid, and continuously returning the condensed working fluid from outside of the enclosure back into the enclosure.

In preferred embodiments, the step of causing the working fluid to form a vapor can take place in the microchannels. The step of condensing can take place in the microchannels. The working fluid can be conveyed substantially only passively.

In another general aspect, the invention features a microelectronics cooling system that includes means for absorbing heat from a microelectronic device in a microelectronic device enclosure through evaporation of a working fluid by a plurality of microchannels that are proximate the microelectronic device within the enclosure and having a cross-sectional dimension to the center of the channel that is about equal to or less than the thermal boundary layer thickness for a working fluid, means for receiving and condensing the working fluid vapor to discharge heat from the fluid outside the enclosure and reform the liquid working fluid, and means for continuously returning the condensed working fluid from outside of the enclosure back into the enclosure. In preferred embodiments, the means for continuously returning the working fluid can operate substantially only passively.

DETAILED DESCRIPTION OF ILLUSTRATIVE EMBODIMENTS

Figure 1:
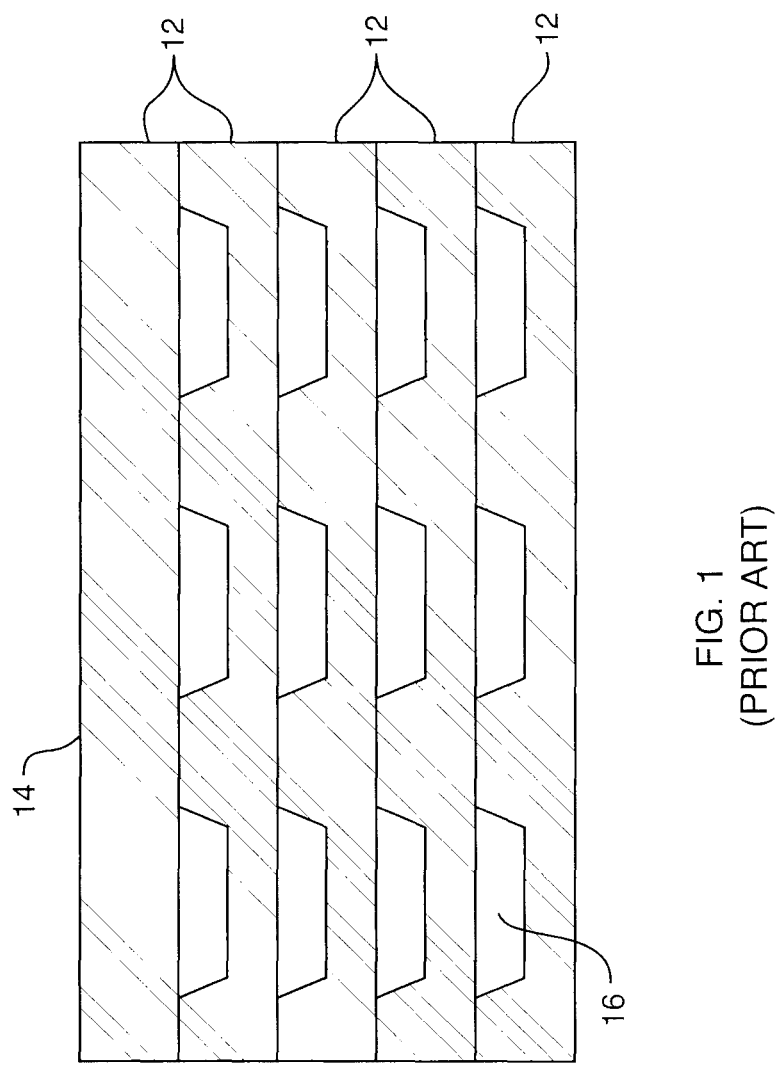
FIG. 1 shows a prior art microchannel heat exchanger core suitable for use in making a heat pipe according to the invention.

According to the invention, so-called "microchannel" heat exchange devices, sometimes also known as "printed circuit" heat exchangers, are used as the heat absorber and/or the heat sink for heat pipes. The inventor has found that heat pipes incorporating such devices afford exceptionally high heat transfer rates between the heat source or sink and working fluid. Without wishing to be bound by any particular theory or explanation, the inventor speculates that the very high efficiency of the inventive heat pipes may result from overcoming a limitation of typical conventional heat pipes, namely that the heat transfer capacity of the central tubular section of the pipe is significantly higher than is realized, due to limitations in the rates at which the heat absorber and/or heat sink transfer heat to and from the central section. In typical conventional configurations, the conductive material in contact with the working fluid and the heat source or cooling medium is relatively thick, typically on the order of 1.2-15 mm in the thinnest dimension. This may limit the rate of heat transfer, due to thermal resistance of the heat exchange material. It is also speculated that heat transfer is further impeded by the fluid film resistance at the boundary layer of the boiling or condensing working fluid adjacent to the heat exchanger material.

The fluid velocity (hydrodynamic) boundary layer thickness is a function of the Reynolds number (Re), and the thermal boundary layer thickness is a function of the hydrodynamic boundary layer thickness divided by the cube-root of the Prandtl number (Pr). The particular functions and equations depend on the system geometry (e.g. flat plates vs. tubes); although phase change can complicate matters.

$$Re = velocity * characteristic\ length * density / viscosity$$

$$Pr = heat\ capacity * viscosity / thermal\ conductivity$$

The characteristic length is the diameter for tubes, and the hydraulic diameter for non-circular channels.

The ratio of the convective to conductive heat transfer across (normal to) the boundary is given by the Nusselt number (Nu).

$$Nu = heat\ transfer\ coefficient * thermal\ conductivity / characteristic\ length$$

In laminar flow (as is the case in microchannels), the Nusselt number is a constant (at least for a given phase), so it can be seen that the heat transfer improves with the inverse of the diameter of channel thickness. This is why heat transfer improves dramatically as the channels get smaller. (The trade-off is the increasing pressure drop/flow reduction as the channels get smaller).

For internal flows (e.g. closed channels and tubes), the flow is laminar when Re<2200. So, one skilled in the art of fluid mechanics can calculate the hydrodynamic and thermal boundary layer thicknesses for known fluid properties, flow conditions, and channel geometry. The maximum microchannel diameter/thickness should be twice the lesser of the either the thermal boundary layer or hydrodynamic boundary layer thickness (factor of two because the boundary layer can extend no farther than the mid-point of the channel).

From the fluid boundary layer equation pertinent to the geometry of interest, which is a function of Re, and the velocity, density, and viscosity (used to calculate Re), one can solve for the limiting dimension or thickness such that the fluid boundary layer thickness is equal to the distance from the wall to the centerline, when Re=2200.

From the thermal boundary layer equation pertinent to the geometry of interest, which is a function of fluid boundary layer thickness divided by the cube-root of Pr, and the heat capacity, thermal conductivity and viscosity (used to calculate Pr), one can calculate the thermal boundary layer thickness.

In contrast to conventional heat pipes, the heat absorber and/or heat sink sections of the inventive heat pipes have sub-millimeter channels and wall thicknesses whose characteristic length is smaller than the thermal boundary layer thickness, substantially reducing both the conductive resistance and the convective/thermal resistance values. While microchannel heat exchangers have been used in ordinary heat transfer services, they have not hitherto been used in conjunction with heat pipes, to transfer heat at high rates between physically separated heating and cooling sources.

The heat pipes of the present invention provide significant enhancement of heat transfer by maximizing heat exchange at the heat absorber and/or heat sink though the use of microchannel heat exchange devices, coupled with the high heat transfer rates over distances associated with the phase changes and movements of the working fluid. In some embodiments of the invention, the heat absorber and/or the heat sink are passive, by which it is meant that no pumps, fans, valves, or other energy-consuming devices are employed in their operation. An entirely passive heat pipe results if both the heat absorber and the heat sink are passive.

The heat pipes of the present invention may be used for any purpose, and are particularly advantageous for use in the dissipation of heat generated by electronic devices. Suitable arrangement of the heat pipe allows the heat generated by the electronic devices to be rejected externally to the enclosures and rooms housing the electronic devices, reducing or obviating the need to air-condition the rooms in which the electronic devices are housed.

The invention will next be illustrated with reference to the Figures, wherein similar numbers indicate similar elements in all Figures. The Figures are intended to be illustrative rather than limiting and are included to facilitate explanation of the invention. The Figures are not to scale, and are not intended to be engineering drawings. Also, it will be appreciated that the devices of the invention may be used for a wide variety of applications, and accordingly the dimensions and materials useful for making them also cover a wide range, and are sometimes interdependent. Therefore, the invention should not be construed as limited by the materials and dimensions explicitly noted in the Figures and associated text.

Heat Pipes Employing Microchannel Heat Absorbers

Prior art microchannel heat exchangers are used as the heat absorber and optionally as the heat sink for heat pipes according to the invention. The cores of the microchannel heat exchangers comprise one or more layers of parallel microchannels, wherein the largest cross-sectional dimension of the microchannels is less than 1000 microns, and preferably less than 250 microns, and the materials of construction of the heat transfer surfaces are materials with thermal conductivities in excess of 5 watts/m-° C., and preferably in excess of 17 watts/m-° C., and most preferably in excess of 170 watts/m-° C. If more than one layer of microchannels is used, the number of layers may be any number from 2 to 10, or in some cases an even larger number, e.g., as high as 20.

Referring now to FIG. 1, the working fluid microchannels 16 of a parallel flow microchannel core 14 for a heat exchanger may optionally be arranged in multiple layers 12, whereby heat transfer to outer layers is achieved by thermal conduction through the material walls connecting the layers of the microchannels. This increases the total effective heat transfer area (internal to the microchannel device) available for evaporation or condensation of the working fluid, without requiring an increase in the surface area in contact with the heat source or sink. When multiple layers are used, each layer is typically fabricated from a thin sheet with etched open channels or grooves, and the layers are bonded or fused to each other, sealing the open tops of the channels or grooves, forming closed microchannels. This arrangement results in a monolithic heat exchanger, with only one thin conducting surface interspersed between adjacent stacks of fluid channels. It also eliminates the need for a conductive spacer and its associated resistance to heat transfer. Such devices are available commercially, with one example being "Ardex" liquid coolers, manufactured by Atotech Deutschland GmbH, headquartered in Berlin, Germany. By using such a configuration for the heat absorber, the heat pipes of the present invention enjoy inherently high rates of conductive heat transfer.

Figure 2A:
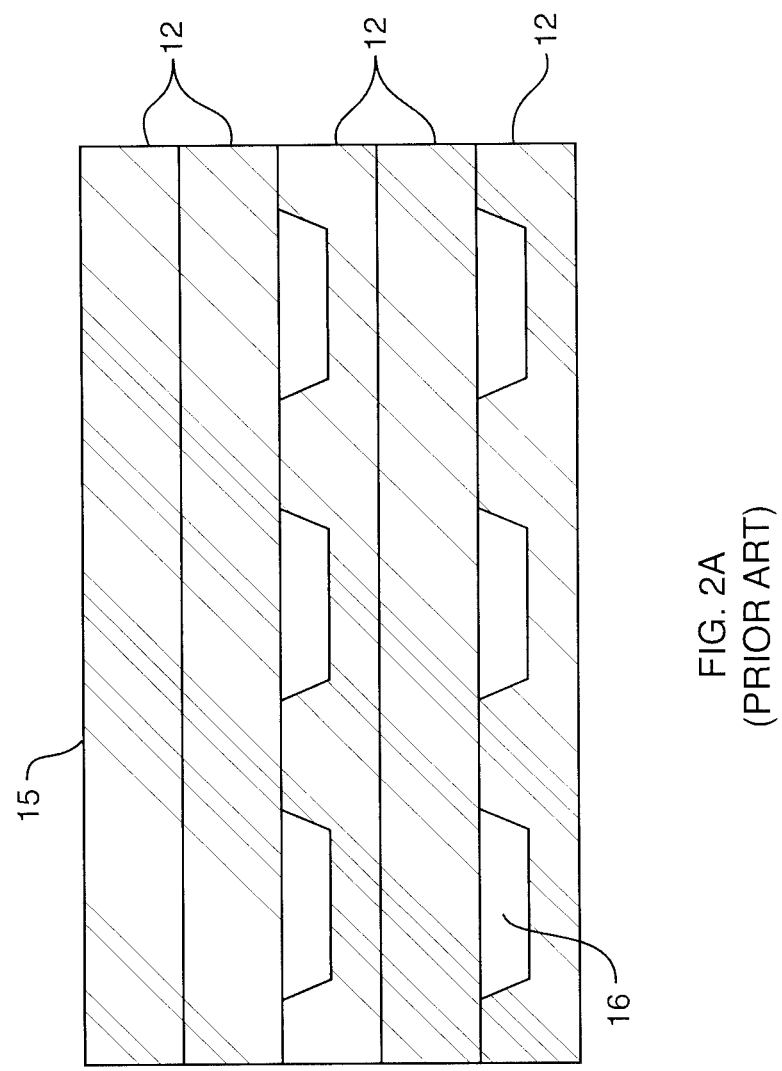
FIGS. 2a and 2b show another prior art microchannel heat exchanger core suitable for use in making a heat pipe according to the invention.
Figure 2B:
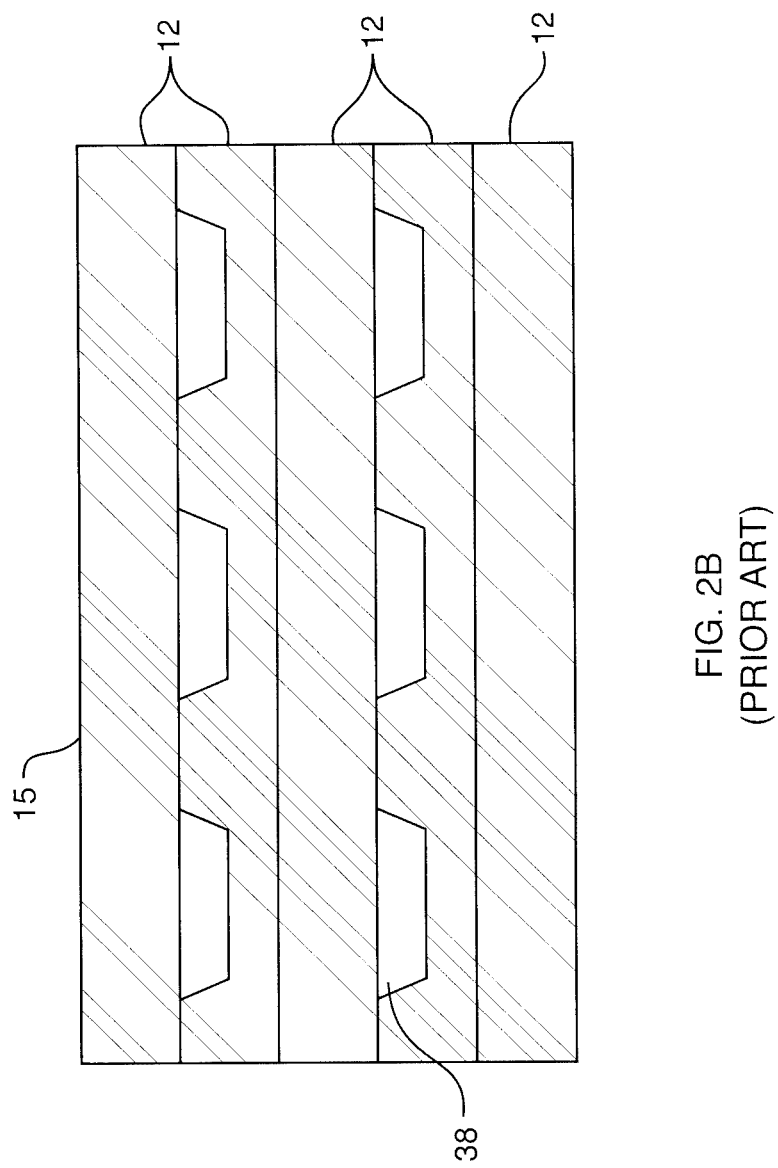

FIGS. 2a and 2b depict another prior art heat exchanger core, shown generally at 15, suitable for use in heat pipes according to the invention. Core 15, referred to herein as a cross-flow microchannel core, has two or more alternating layers 12 of microchannels, i.e., working fluid microchannels 16 as described above alternating with intermediate fluid microchannels 38. The orientation of the layers is such that alternating layers meet at common inlet and outlet regions, allowing the intermediate fluid to flow through the unit without co-mingling with the working fluid. The intermediate fluid may be any liquid or gas suitable for transferring heat away from cross-flow microchannel core 15 (in the case where the core is used in a heat sink) or to core 15 (if the core is used in a heat absorber). It is preferable to arrange the channel and layer orientation so that two fluids flow through their respective channels in directions substantially perpendicular to each other. FIG. 2a shows the heat exchanger from the side showing the working fluid microchannels 16, and FIG. 2b shows it from a side perpendicular to the first, i.e., rotated 90° about a vertical axis, showing the intermediate fluid microchannels 38. Such devices are available commercially, with one example being a Printed Circuit Heat Exchanger (PCHE), manufactured by Heatric, headquartered in Dorset, England.

Figure 3:
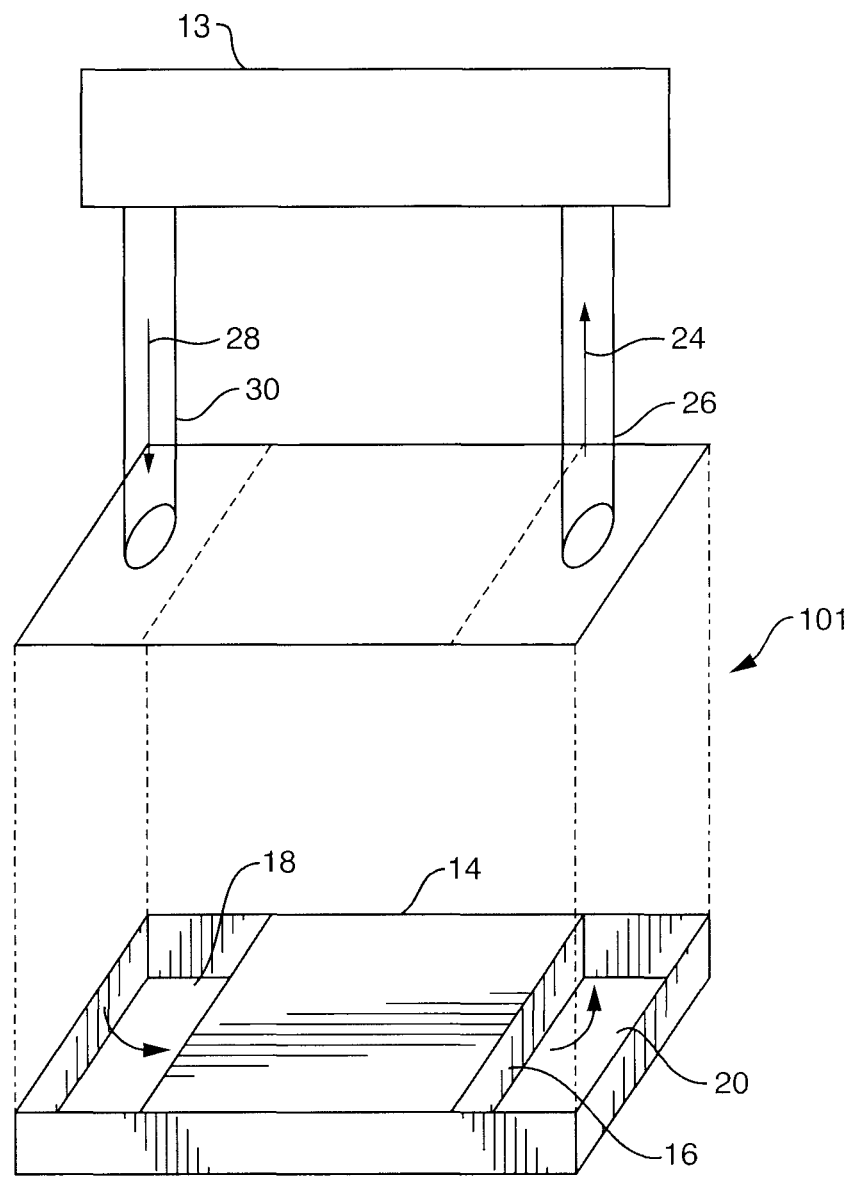
FIG. 3 shows a heat pipe according to the invention, employing a heat absorber using a parallel flow microchannel core and two pipes for connection to the heat sink.

Referring now to FIG. 3, there is shown an exploded view of a microchannel heat absorber 101 for use in a heat pipe according to the invention. This type of heat pipe is a 2-pipe configuration, also known as a thermosyphon. Heat is conducted from the heat source, i.e., the object or fluid that is to be cooled (not shown), through the surface of the bottommost layer of core 14 by conduction. The heat is further conducted into the working fluid microchannels 16 of the parallel flow microchannel core 14, constructed for example as shown in FIG. 1. Where multiple layers of microchannels are used in core 14, some of the heat is conducted to the succeeding layers by conduction through the sidewalls of layers.

The heat absorber is connected to an elevated heat sink shown schematically at 13 by means of two pipes or tubes of ordinary dimensions, typically having an inside diameter from about 50 mils to about one inch. However, there is no fundamental limit to the diameter—the larger the diameter, the higher the axial power rating, i.e. the amount of heat that can be transferred between the heat source and the heat sink. Thus, the diameter may be 2 or 3 inches or even greater. Vaporized working fluid exits parallel flow microchannel core 14 into the warm side manifold 20 and flows from the heat absorber to the heat sink by means of warm side pipe 26 (preferably of larger diameter than cool side pipe 30). At heat sink 13, the working fluid gives up its heat to a cooling medium, causing it to condense back to liquid. The condensed liquid working fluid returns from the heat sink by gravity via cool side pipe 30 to cool side manifold 18 and then into parallel flow microchannel core 14, completing the cycle.

While heat sink 13 is preferably a microchannel heat exchanger, it may alternatively be of any of any convenient design to facilitate condensation of the working fluid, e.g., a conventional heat exchanger, air-cooled finned tubes or hollow plates, thermoelectric cooler, etc.

Figure 4:
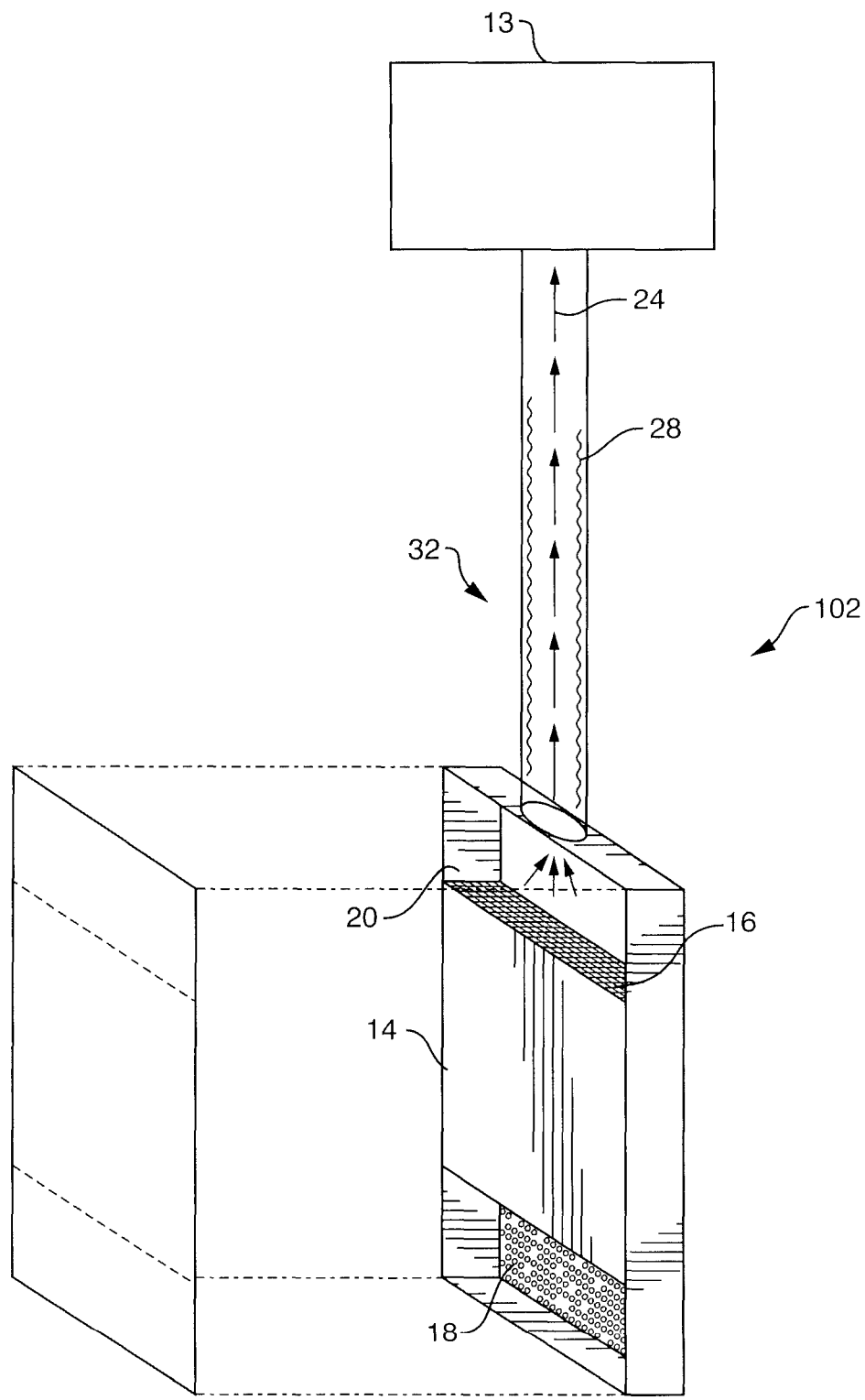
FIG. 4 shows a heat pipe according to the invention, employing a heat absorber using a parallel flow microchannel core and a single pipe for connection to the heat sink.

FIG. 4 shows an embodiment of the invention in which the heat absorber 102 is similar to that described in FIG. 3, but is connected to heat sink 13 by means of common connecting pipe 32, through which vaporized working fluid 24 and liquid working fluid 28 move co-axially and counter-currently. The heat pipe functions in a manner similar to that of FIG. 3, except that vaporized working fluid 24 moves through the central portion of common connecting pipe 32, and liquid working fluid 28 travels along the walls of the pipe, e.g., as a moving annular film. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

Figure 5:
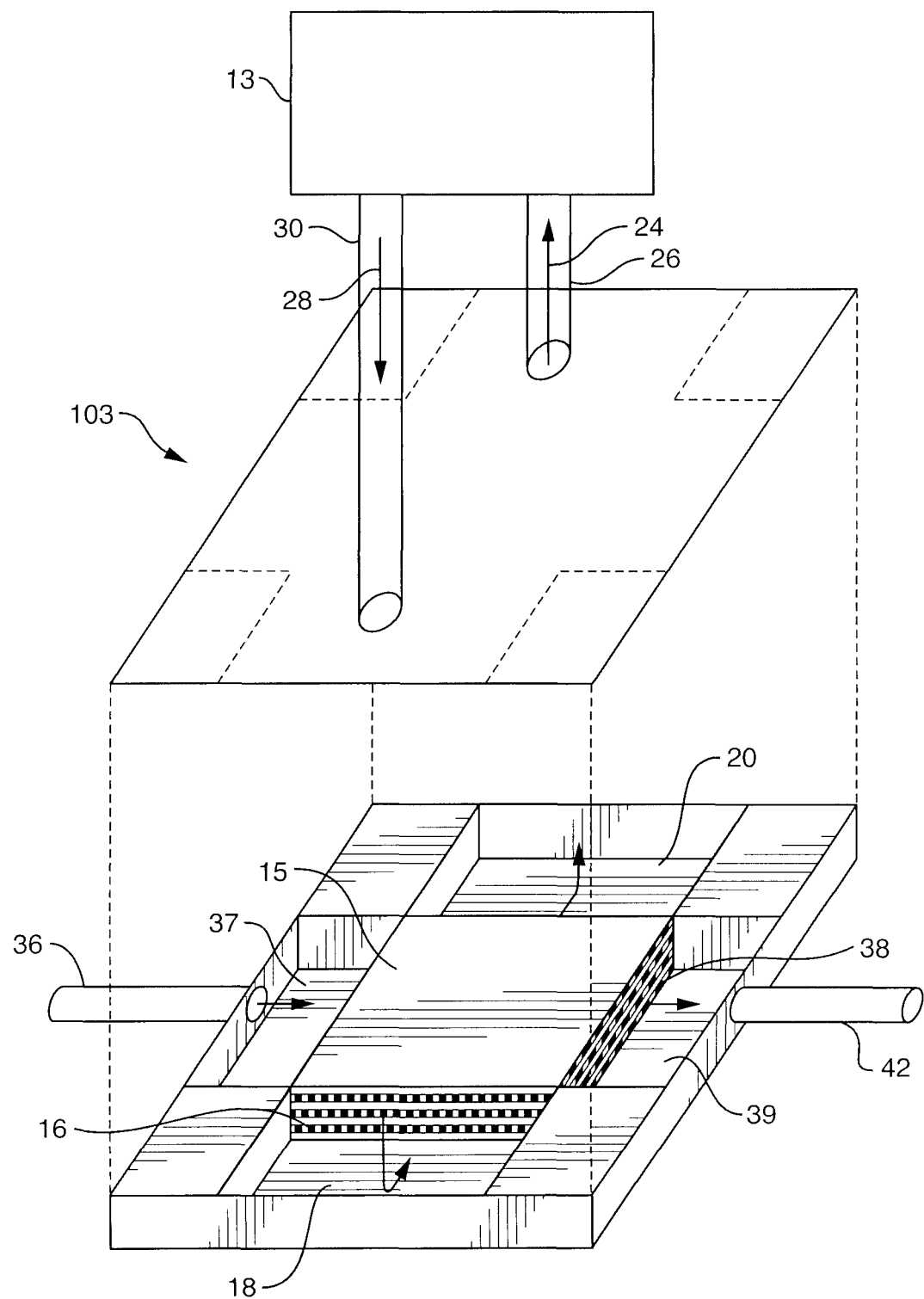
FIG. 5 shows a heat pipe according to the invention, employing a heat absorber using a cross-flow microchannel core and two pipes for connection to the heat sink.

FIG. 5 shows another embodiment of the invention, employing a heat absorber 103 that includes a cross-flow microchannel core 15 such as shown in FIG. 2. Heat is transferred from the heat source to heat absorber 104 by means of an intermediate fluid, e.g., liquid, gas, or condensable vapor. The relatively hot/warm intermediate fluid enters through inlet pipe 36 into inlet manifold 37, flows through intermediate fluid microchannels 38, exits cross-flow microchannel core 15 into outlet manifold 39 at a lower temperature, and exits the heat absorber via outlet pipe 42. While in cross-flow microchannel core 15, the intermediate fluid is cooled by the working fluid through heat conduction into the (boiling) working fluid in the intervening layers, via the walls of the working fluid microchannels 16 and the intermediate fluid microchannels 38.

Figure 6:
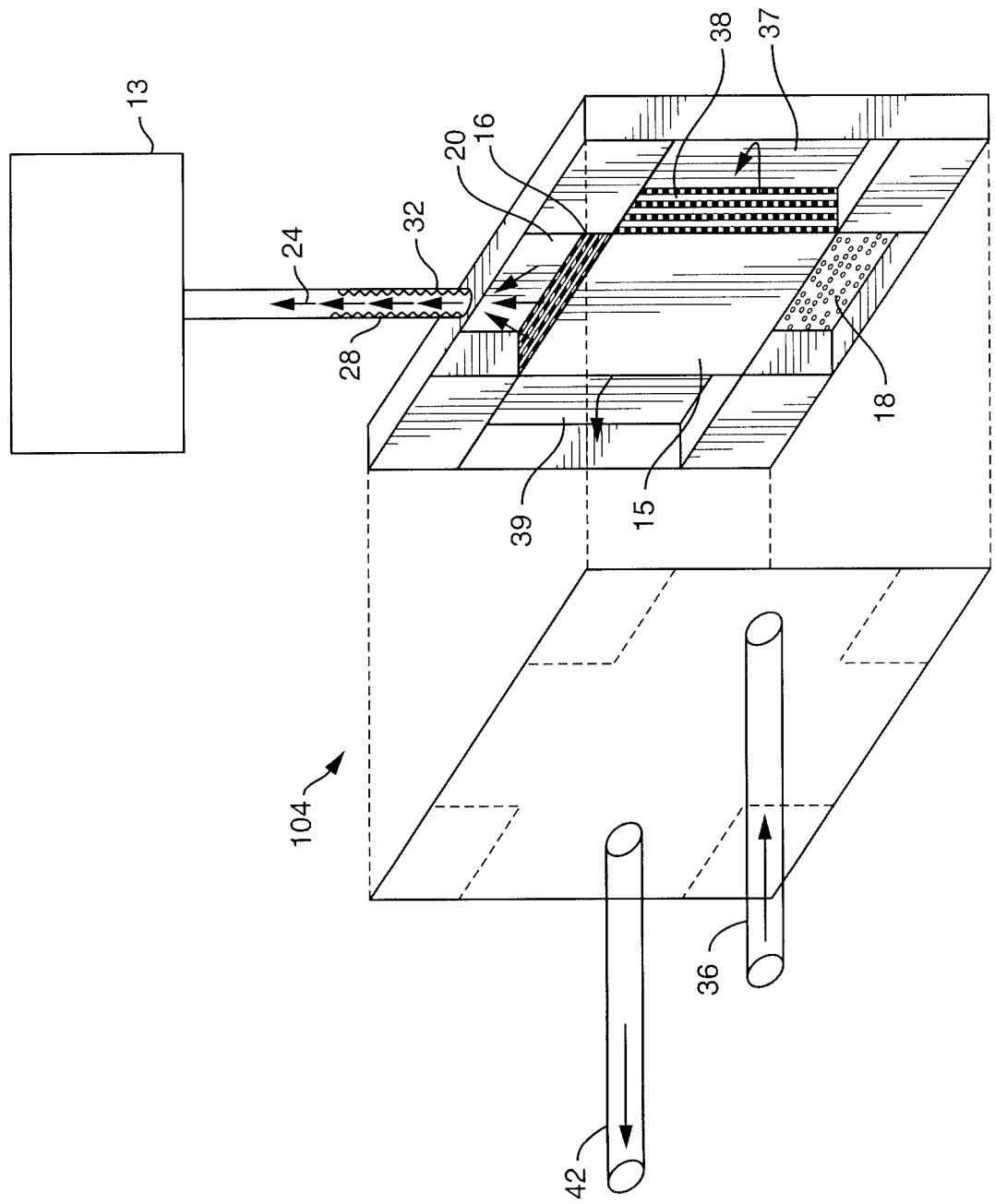
FIG. 6 shows a heat pipe according to the invention, employing a heat absorber using a cross-flow microchannel core and a single pipe for connection to the heat sink.

FIG. 6 shows another embodiment of the invention, in which the heat absorber 104 is connected to a heat sink shown schematically at 13 by means of common connecting pipe 32, through which vaporized working fluid 24 and liquid working fluid 28 move co-axially and counter-currently. The vapor moves through the central portion of the connecting pipe, and the liquid travels along the walls of the pipe, e.g., as a moving annular film. Heat is transferred from the heat source to heat absorber 103 by means of an intermediate fluid, e.g., liquid, gas, or condensable vapor. The intermediate fluid enters through inlet pipe 36 into inlet manifold 37, flows through intermediate fluid microchannels 38, exits cross-flow microchannel core 15 into outlet manifold 39, and exits 103 via outlet pipe 42. While in cross-flow microchannel core 15, the intermediate fluid is cooled by the (boiling) working fluid through heat conduction into the working fluid in the intervening layers, via the walls of the working fluid microchannels 16 and the intermediate fluid microchannels 38. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

Heat Pipes Employing Microchannel Heat Sinks

Figure 7:
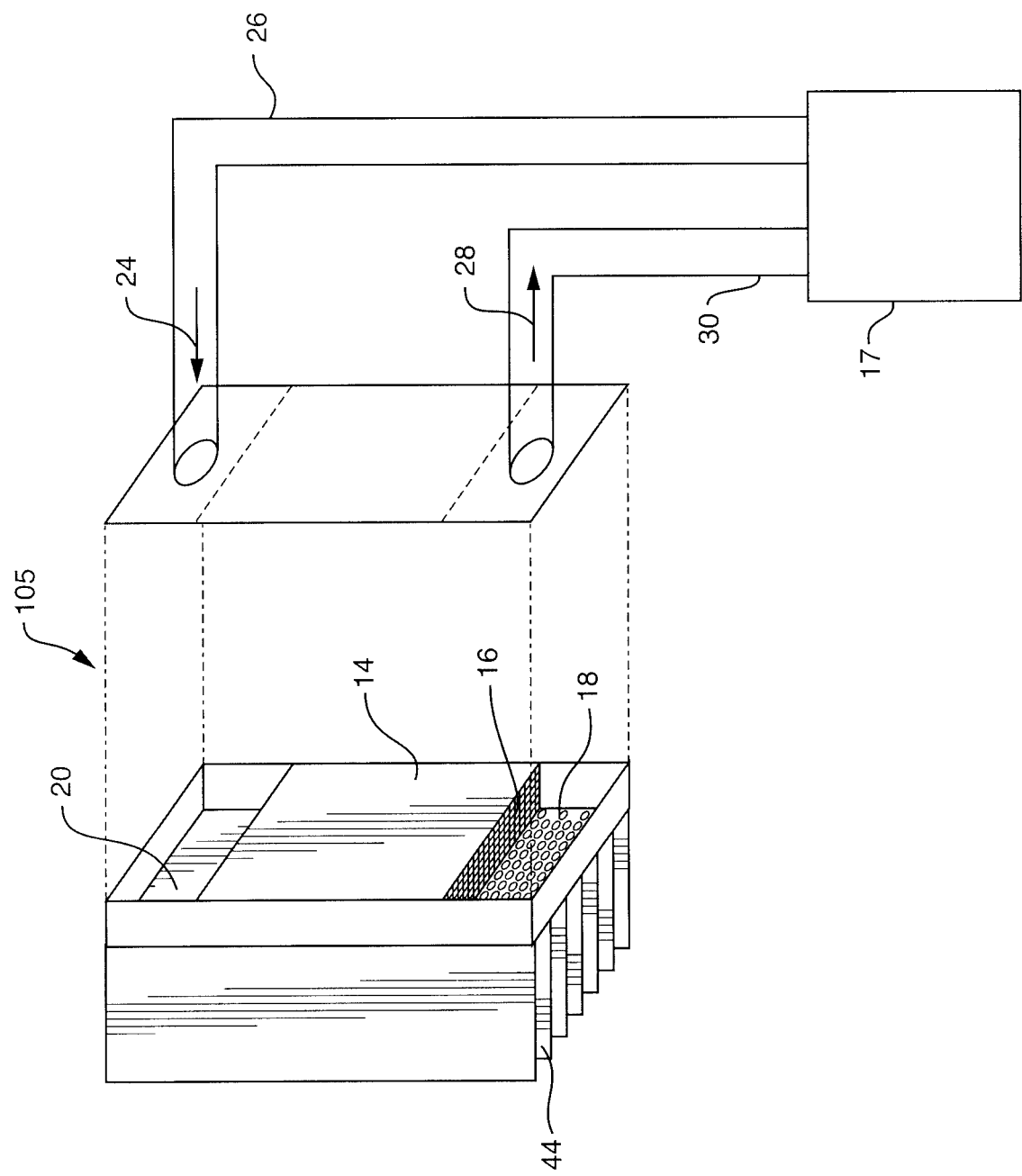
FIG. 7 shows a heat pipe according to the invention, employing a heat sink using a parallel flow microchannel core and two pipes for connection to the heat absorber.

Referring now to FIG. 7, there is shown an embodiment of the invention in which the heat sink 105 is a microchannel heat exchanger with extended surfaces cooled by natural or forced convection with air or other fluid coolants, and the heat pipe has separate connecting pipes for the liquid and vaporized working fluid. The structure is similar to that of the heat absorber shown in FIG. 3, with the addition of cooling surfaces 44, and the spatial orientation is typically as shown in FIG. 7, i.e., rotated about a horizontal axis extending into the page 90° relative to the way it would be oriented when used as a heat absorber such as in FIG. 3.

The cooling surfaces 44 are provided on the outside of one or both sides of a single-layer unit, or the outsides of one or both of the outermost layers in a multi-layer unit. They may comprise thin extensions of thermally conductive material, to provide additional heat transfer surface area exposed to the air or other final cooling medium. The extended surfaces may be of any convenient geometry or orientation, e.g., pins, parallel perpendicular fins, spaced fibers, ribs, and the like.

Heat sink 105 is connected to a microchannel heat absorber shown schematically at 17 located at a lower elevation by means of two pipes or tubes of ordinary dimensions, typically having an inside diameter from about 50 mils to about one inch. However, there is no fundamental limit to the diameter—the larger the diameter, the higher the axial power rating. Vaporized working fluid flows from the heat absorber to the heat sink by means of warm side pipe 26 and enters parallel flow microchannel core 14 at warm side manifold 20. Heat is conducted out of the heat sink via cooling surfaces 44 into a surrounding fluid, which may be a gas such as air or a liquid, resulting in condensation of the working fluid in working fluid microchannels 16. The condensed liquid working fluid exits parallel flow microchannel core 14 at cool side manifold 18 returns via cool side pipe 30 to by gravity to the heat absorber. Warm side pipe 26 is preferably connected at a high point above parallel flow microchannel core 14.

Figure 8:
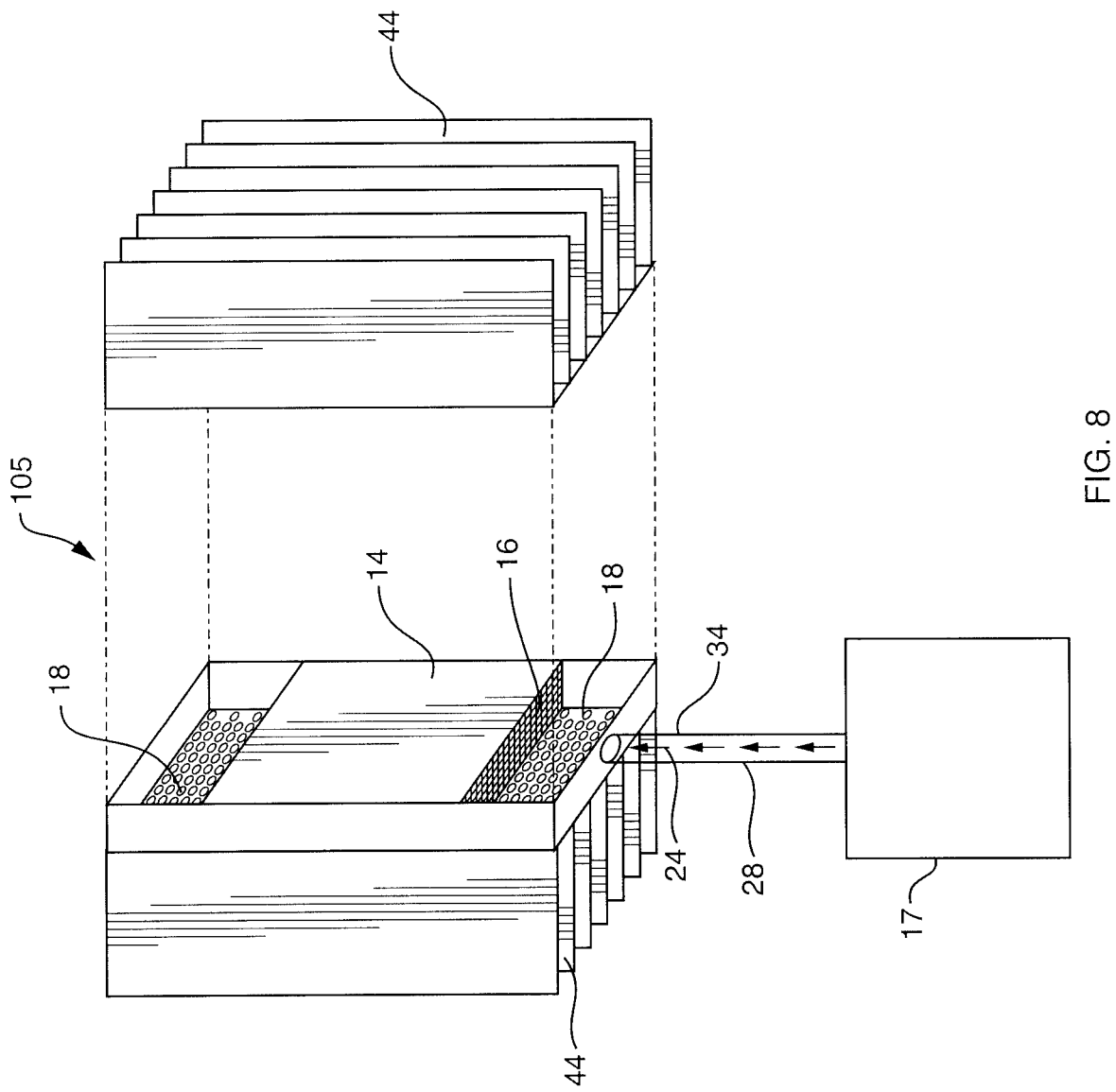
FIG. 8 shows a heat pipe according to the invention, employing a heat sink using a parallel flow microchannel core and a single pipe for connection to the heat absorber.

FIG. 8 shows an embodiment of the invention in which the heat sink, shown generally at 106, is a microchannel heat exchanger similar to the heat absorber shown in FIG. 4, with the addition of cooling surfaces 44 as described above. As shown in FIG. 8, its typical orientation will be inverted relative to the orientation when used as a heat absorber.

Vaporized working fluid 24 flows from the heat absorber shown schematically at 17 to the heat sink by means of common connecting pipe 32 and enters parallel flow microchannel core 14 at warm side manifold 20. Heat is conducted out of the heat sink via cooling surfaces 44 into a surrounding fluid, which may be a gas such as air or a liquid, resulting in condensation of the working fluid in working fluid microchannels 16. Condensed liquid working fluid 28 travels along the walls of common connecting pipe 32, e.g., as a moving annular film. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

In another embodiment of the invention, the heat sink is constructed in substantially the same manner as the heat absorber shown in FIG. 5, but with an inverted orientation. Heat is transferred out of the heat sink by means of the intermediate fluid (liquid or gas), which is at a relatively low temperature when it enters cross-flow microchannel core 15 via inlet pipe 36 and inlet manifold 37, and which exits cross-flow microchannel core 15 at a higher temperature via outlet manifold 39 and outlet pipe 42. Condensation of vaporized working fluid occurs in a manner substantially the same as described above with respect to FIG. 7, except that heat exits the heat sink via the intermediate fluid.

In another embodiment of the invention, the heat sink is constructed in substantially the same manner as the heat absorber shown in FIG. 6, but with an inverted orientation. Entry and condensation of vaporized working fluid 24, and return of liquid working fluid 28, occur substantially the same way as described with respect to FIG. 8, and heat is transferred out of the heat sink in substantially the same way as in the device of FIG. 1. In another embodiment common connecting pipe 32 has an annular or co-axial wick for co-axial counter-flow of the liquid and vaporized working fluid, as described previously.

In another embodiment of the invention, the heat sink is constructed in substantially the same manner as the heat absorber shown in FIG. 3, but with an inverted orientation. Heat is removed from the heat sink by thermal conduction through the outer surfaces into a cooling medium. The cooling medium may be a fluid (e.g., the heat sink is immersed), or a cool solid which is kept cool by external means, e.g., by refrigeration, thermo-electric cooling, evaporation of an external fluid, sensible heating of a flowing external fluid, etc. Condensation of vaporized working fluid occurs in a manner substantially the same as described above with respect to FIG. 7.

In another embodiment of the invention, the heat sink is constructed in substantially the same manner as the heat absorber shown in FIG. 4, but with an inverted orientation. Entry and condensation of vaporized working fluid 24, and return of liquid working fluid 28, occur substantially the same way as described with respect to FIG. 8, and heat is removed from the heat sink by thermal conduction through the outer surfaces into a cooling medium as described in the immediately preceding embodiment. In another embodiment, common connecting pipe 32 has an annular or co-axial wick for co-axial counter-flow of the liquid and vaporized working fluid, as described previously.

According to the invention, any microchannel heat absorber may be combined with any heat sink. Microchannel heat sinks will be used in many situations. For example, the heat sink of FIG. 8 may be combined with the heat absorber of FIG. 4. Or, the heat sink of FIG. 7 may be combined with the heat absorber of FIG. 3. Other combinations will be apparent to those of skill in the art, and all of these are contemplated by the invention.

Working Fluids

Many fluids may be used as the working fluid in heat pipes according to the invention. The fluid must have sufficient vapor pressure under the temperature and pressure conditions of use to allow significant vaporization and condensation, as described earlier herein. Since temperature and pressure conditions vary substantially from one application to the next, a wide variety of fluids may be used. Common examples include water, alcohols and hydrocarbons. The inventor has found that heat pipes according to the invention are particularly useful when the working fluid is a fluorocarbon (FC) or hydrofluorocarbon (HFC) or a chlorofluoroalkene (CFA) or a chlorinated hydrofluoroalkene (CHFA), or a mixture of these. In the event of a loss of containment, these materials are unlikely to ignite, have minimal adverse environmental or health consequences, cause no damage to electronic components, create no risk of electric shock, and are readily dissipated. They are low in toxicity, electrically non-conductive, non-corrosive to most materials, and have little or no flammability.

Suitable FC, HFC, CFA or CHFA working fluids will typically be chosen to match their thermodynamic properties to the particular working temperatures and pressures of the heat pipe systems in which they are used. Exemplary fluids include any of the various commercially available pentafluoropropanes, hexafluoropropanes, pentafluorobutanes, and monochloro fluoropropenes. For heat pipes operating in the range of ambient (about 20° C.) to about 100° C., exemplary suitable working fluids include those having normal boiling points (i.e., boiling points at atmospheric pressure) in the range of 10° C. to 80° C., and more typically in a range from 10° C. to 45° C. Suitable classes of HFC's include pentafluoropropanes, hexafluoropropanes, and pentafluorobutanes. Specific examples of suitable HFC's include HFC-245fa, HFC-245ca, HFC-236ca, HFC-365mfc, and mixtures thereof. Specific examples of suitable CHFA's include HCFC 1233zd, and HCFC 1233cf. Heat pipe systems including these working fluids typically operate at pressures mildly elevated with respect to atmospheric pressure. In some embodiments, heat pipes according to the invention may have heat sinks operating at a condensation temperature of about 30° C. to about 50° C., and HFC-245fa, HFC-245ca, HFC-236ca, HFC-365mfc, HCFC 1233zd, and HCFC 1233cf may be particularly well suited for use in such systems.

In one embodiment, the invention provides a method of cooling an article, liquid, or gas with heat pipe system using as its working fluid HFC-245fa, HFC-245ca, HFC-236ca, HFC-365mfc, HCFC 1233zd, HCFC 1233cf, or a mixture of these. In this embodiment the structure of the heat pipe may be any described herein, but the inventor contemplates the use of these fluids in a heat pipe of any structure as well. Thus heat pipe systems of any structure containing these fluids, and methods of cooling by the use of such systems, are also claimed.

In some embodiments of the invention, heat pipes such as disclosed herein may be installed in electronic equipment to expel heat from a microelectronic device to a location external to the electronic device enclosure.

For microelectronic devices/enclosures that are housed in air-conditioned rooms, e.g., computer data centers, industrial control rooms, and the like, it is preferred in some embodiments to place the heat sink of the heat pipe in an air duct or water pipe, so that a flow of ambient (externally supplied) air or cooling water, rather than air-conditioned air, is used to carry away the rejected heat to a location external to the room or building housing the microelectronic devices. Such an arrangement allows the cooling and heat removal to be accomplished with little or no air conditioning dedicated to the electronic devices, thereby reducing energy consumption.

The interconnecting pipe(s) need not be integral with the heat absorber or heat sink sections. The connecting pipes may be assembled separately from and joined to the heat absorber and heat sink sections. As a consequence, the interconnecting pipes can be of any convenient length, provided that the pressure drop is less than the driving force (gravity and/or capillary pressure) for returning the condensed liquid to the heat absorber. The use of relatively long interconnecting pipes allows the heat sink and its associated cooling medium to be located remotely from the heat source. In the case of an enclosed heat source, e.g., microelectronic device, combustion chamber, radioactive area, etc., this allows the heat to be removed without transferring heat back to other objects in the immediate vicinity of the heat source. It also allows the use of cooling media other than air at the heat sink, e.g., water, refrigerated fluids, thermoelectric cooling devices, etc. In some embodiments, the length of the pipes may be in a range from 5 to 10 inches, for example when used to reject heat from inside an electronic device (e.g., a personal computer) to the surrounding air. In other embodiments, the length may be from 5 to 10 feet or even from 5 to 30 feet, such as when heat is to be rejected to an air vent or outside of the room containing the heat source. However, the length may be even greater if the connecting diameter is sufficiently large to keep the pressure drop low enough for good flow.

Warm side pipe 26, cool side pipe 30, and common connecting pipe 32 will typically have smaller cross-sections than the heat absorber or heat sink sections, to facilitate the collection and flow of the liquid and vaporized working fluid. The pipes may be of any arbitrary shape and, if suitably thin-walled, may be readily flexed or bent to accommodate off-set placement of the heat sink relative to the heat absorber, and/or routing of the connecting pipes around other objects.

EXAMPLES

Example 1—Air-Cooled Single-Tube Non-Wick Heat Pipe System

A heat pipe system is constructed, consisting of a microchannel block-type heat absorber, a finned microchannel heat sink, a connecting pipe, and a working fluid. The heat absorber is an Atotech "Ardex MC-1" microchannel CPU cooler, manufactured by Atotech Deutschland GmbH of Berlin, Germany. One of the two threaded ports is provided with a male adapter ⅜" tube fitting. The other threaded port is closed off with a pipe plug. The heat sink is an Atotech "Ardex MC-1" microchannel CPU cooler, modified by the addition of thin sheet metal copper cooling fins soldered to the flat side of the MC-1 device. One of the two threaded ports is provided with a male adapter ⅜" tube fitting. The other threaded port is closed off with a pipe plug. The connecting pipe is a ⅜" diameter semi-flexible copper or perfluoroalkoxy (PFA) plastic tube, connected to the absorber and heat sink by means of the tube fittings. The connecting pipe is preferably insulated, to minimize heat transfer between the connecting tube and the air space surrounding it. This is useful if the heat pipe connecting tube is within an enclosure (and the heat sink outside the enclosure), to minimize the temperature rise in the enclosure and ensure maximum rejection of heat from the heat source while minimizing heat-up of the enclosure. The connecting pipe is optionally bent, to allow the heat sink to be offset from the heat absorber.

The heat pipe assembly and a container of working fluid (HFC-245fa) is chilled in a domestic refrigerator, to approximately 4.4° C. (40° F.). The chilled liquid working fluid is charged to the heat pipe assembly by removing the pipe plug from the heat absorber, and poured in until the liquid level is approximately at same level as the top of the microchannel plate stack. After charging with the working fluid, the pipe plug is replaced, sealing the system.

The heat pipe assembly is oriented vertically, with the heat absorber block at the bottom, and the finned heat sink section at the top. The heat absorber block is placed in direct contact with the hot object to be cooled, e.g., a central processing unit (CPU) of a computer, which generates heat during operation. The finned heat sink section is exposed to ambient temperature air, which may optionally be circulated around the fins by means of an external fan, to improve the rate of heat removal.

Conduction of heat from the hot object via the heat transfer block causes the working fluid to boil. The vapors travel via the central portion of the connecting pipe, and are cooled and condensed by conduction with the finned heat sink section, and the heat is rejected by convection to the ambient air. The condensed fluid returns by gravity along the walls of the connecting pipe to the heat transfer block, allowing the cycle to repeat. During operation, the temperature of the working fluid rises to a value intermediate between that of the heat source and that of the ambient air external to the heat sink.

At steady state conditions (e.g., assuming heat generation at a constant rate or wattage) the temperature of the working fluid is determined by the heat absorption being in balance with the heat rejection, according to the following relationships:

$$Q_{absorbed} = U_{absorber} \times A_{absorber} \times (T_{hot} - T_{fluid})$$

$$Q_{rejected} = U_{sink} \times A_{sink} \times (T_{fluid} - T_{air})$$

$$T_{fluid} = \frac{(U_{absorber} \times A_{absorber} \times T_{hot}) + (U_{sink} \times A_{sink} \times T_{air})}{U_{absorber} \times A_{absorber} \times U_{sink} \times A_{sink}}$$

Where
Q=heat transfer rate
U=heat transfer coefficient
A=heat transfer area
$T_{hot}$=temperature of heat source

Example 2: Air-Cooled Two-Tube Non-Wick Heat Pipe System

A heat pipe system was constructed, consisting of an Atotech Ardex P microchannel block-type heat absorber, a finned microchannel heat sink, two connecting pipes, and a working fluid. The microchannel heat sink consisted of an Atotech Ardex P microchannel block soldered to a CompUSA Pentium 4 Socket 478 CPU cooler fin-fan assembly. The heat pipe assembly consisted of substantially the same equipment and construction as used in Example 1, with the following differences. The second port of the heat absorber was provided with a ¼" tube fitting male run tee, in lieu of the pipe plug. The second port of the heat sink was provided with a male adapter ¼" tube fitting, in lieu of the pipe plug. Two connecting pipes were used. The vapor pipe was a ⅜" diameter PFA tube, and the liquid pipe was a ¼" PFA tube. The connecting tubes were connected to the absorber by means of the tube fittings on the heat absorber and the heat sink. The working fluid was charged by means of the unused port on the tee connected to heat absorber. After charging, the port was capped with a tube-fitting plug.

The heat pipe assembly was oriented vertically, with the heat absorber block at the bottom, and the finned heat sink section at the top. The heat absorber block was placed in direct contact with the hot object to be cooled. A 2¼ inch square×½ inch thick aluminum block, provided with an electrical cartridge heater embedded in the middle of the block and connected to a Variac™ power source, was used to simulate the central processing unit (CPU) of a computer, which generates heat during operation. The heated block was provided with a thermocouple embedded in the block, adjacent to the cartridge heater. The finned heat sink section was exposed to ambient-temperature air. (Note, although not done in this example, air may optionally be circulated around the fins by means of an external fan, to improve the rate of heat removal.)

Conduction of heat from the hot object via the heat transfer block caused the working fluid to boil. The vapors traveled via the larger diameter vapor pipe, and are cooled and condensed by conduction with the finned heat sink section, and the heat was rejected by convection to the ambient air. The condensed fluid returned by gravity to the heat transfer block via the smaller diameter liquid return pipe, allowing the cycle to repeat. The fluid flow was visible in the semi-transparent PFA tubing. The temperature and pressure of the working fluid reached steady state, substantially as described in Example 1. A plot of the block temperature as a function of cartridge heater power (wattage) is shown in FIG. 9, in comparison with the temperatures obtained using an un-cooled block, a block cooled by a conventional "pin-fin" CPU cooler, and an empty Ardex P cooling block.

Figure 9:
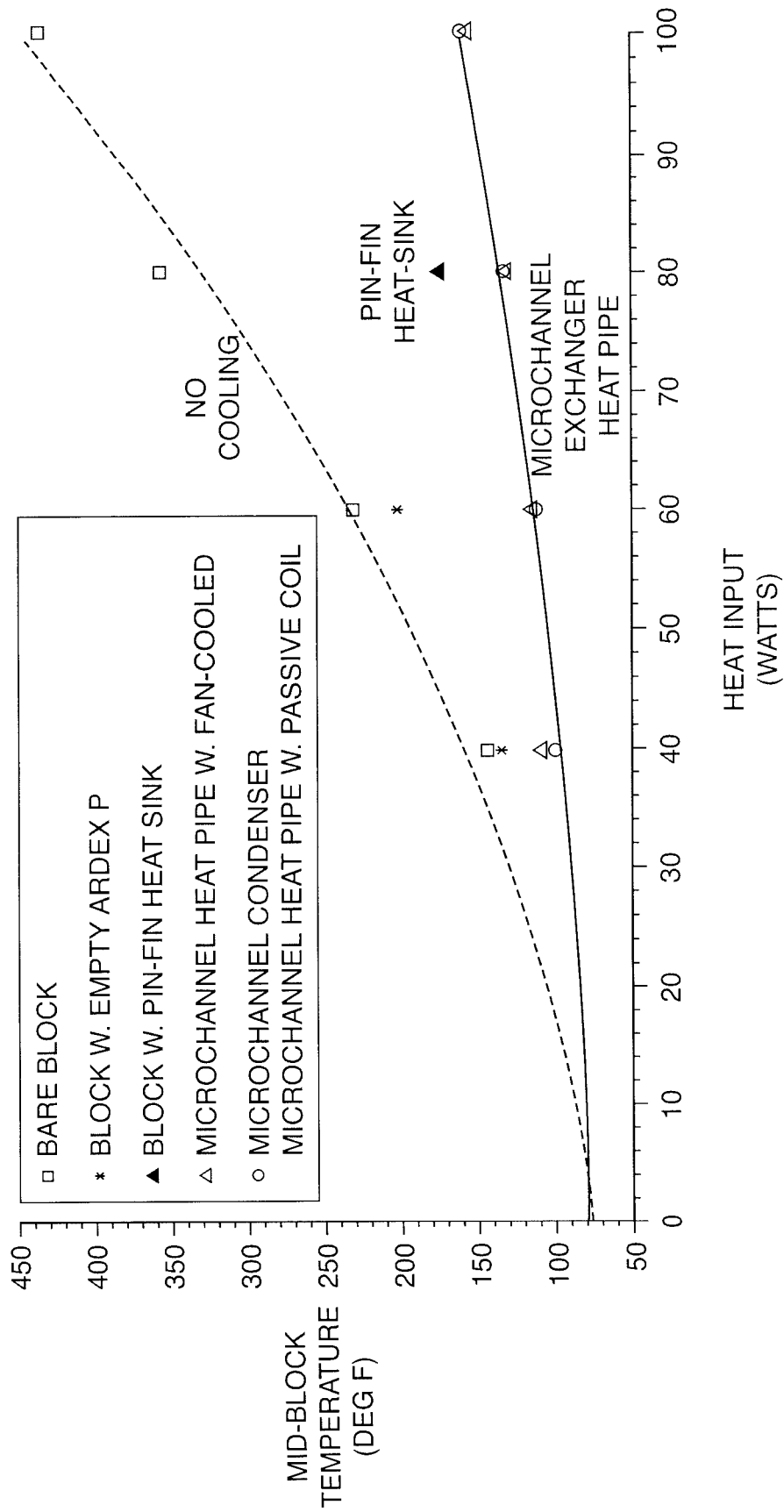
FIG. 9 is a graph showing the heat removal performance of two heat pipes according to the invention compared with prior art cooling devices.
Figure 10:
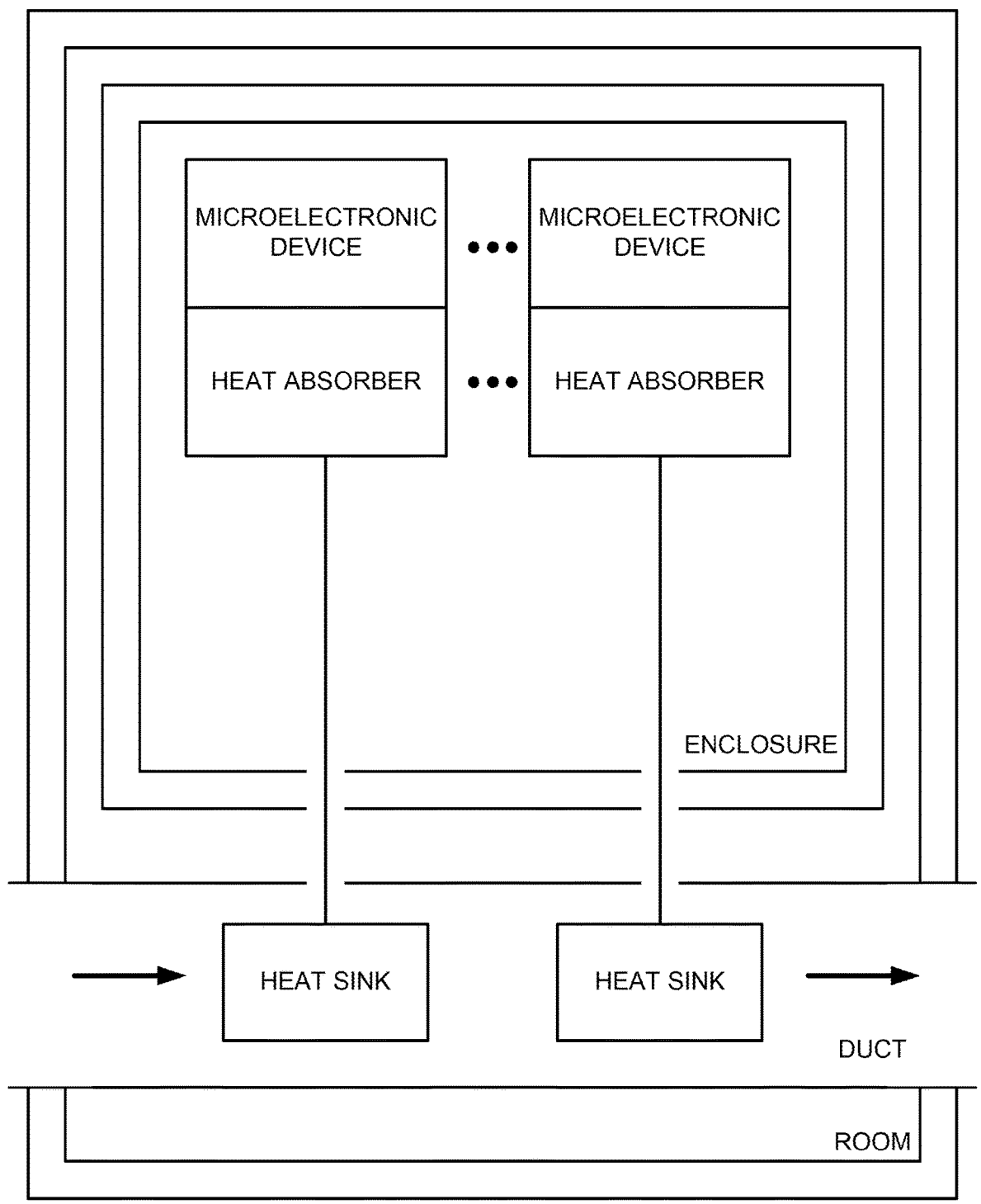
FIG. 10 shows a heat pipe system according to one example of the invention.
Figure 11:
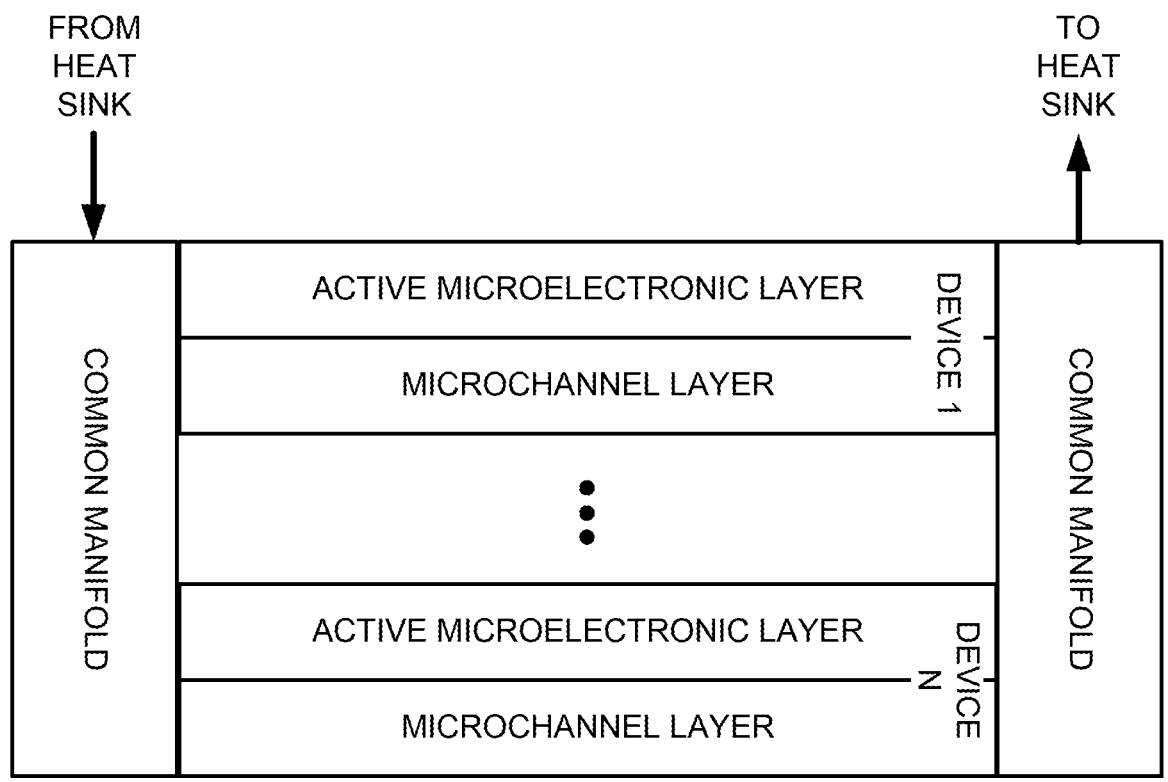
FIG. 11 shows a plurality of microelectronic devices cooled by a plurality of microchannel heat absorbers connected by common manifolds to a heat sink.

As can be seen from the data in FIG. 9, the bare block without cooling became extremely hot at the higher power input levels, and a prior art pin-fin CPU cooler provided some degree of cooling. However, the two heat pipes using microchannel heat absorbers according to the invention provided substantially more cooling than the pin-fin cooler. In fact, the microchannel systems provided better cooling (lower block temperature) at 100 watts power input than the pin-fin cooler did at only 80 watts. For comparison, a run is also shown using a microchannel heat pipe without any working fluid (labeled "Block w. Empty Ardex P"), and this provided minimal cooling as expected.

Example 3: Liquid-Cooled Single-Tube Heat Pipe System

A heat pipe system is constructed, consisting of a microchannel block-type heat absorber, a water-cooled microchannel heat exchanger heat sink, a connecting pipe, and a working fluid. The heat pipe assembly consists of substantially the same equipment as described in Example 2, with the following differences. The heat sink is a cross-flow 2-fluid microchannel heat exchanger. The working fluid is the first fluid, and flowing cooling water is the second fluid, so that heat is removed from the system by heat transfer from the condensing working fluid vapors, through the walls of the microchannel heat sink, into the cooling water.

Example 4: Air-Cooled Single-Tube Heat Pipe System with Wick

A heat pipe system similar to that of Example 1 is constructed, except that an annular band of porous wicking material is inserted along the inside wall of the connecting pipe. In this example, the wicking material is an annular roll of sintered −35+65 mesh spherical fine-mesh stainless steel powder. The wicking material causes the condensed working fluid to return to the heat absorber block by capillary action. This allows the heat pipe to be oriented horizontally or even with the heat sink section below the heat absorber block, provided that the capillary force is greater than the gravitational force acting on the returning fluid.

Example 5: Air-Cooled Dual-Tube Heat Pipe with Liquid Return Line Wick

A heat pipe system similar to that of Example 2 is constructed, except that the liquid return pipe is packed with porous wicking material. In this example, the wicking material is a braid of fiberglass. The wicking material causes the condensed working fluid to return to the heat absorber block by capillary action. This allows the heat pipe to be oriented horizontally or even with the heat sink section below the heat absorber block, provided that the capillary force is greater than the gravitational force acting on the returning fluid.

Example 6: Cooling of a Microelectronic Device by Means of a Heat Pipe, Rejecting the Heat Externally to the Microelectronic Device Enclosure and Room A heat pipe system similar to that of Example 4 is constructed with the heat absorber in contact with the surface of a computer microprocessor (i.e. central processing unit or CPU) to provide a means of cooling to remove the heat generated by the CPU, to prevent overheating. The wick-bearing connecting tube is routed externally to the housing of the computer, and the finned heat sink is placed in an air duct, wherein the air duct is supplied with non-air-conditioned fresh air from outside the room or building housing the computer. Using this configuration, the air warmed by the rejected heat is routed outside the room or building housing the computer.

This arrangement may be repeated for multiple microelectronic devices, e.g., other heat generating processors (such as graphic processing units or GPUs), controller "chips", power supplies, and the like that are housed in a common enclosure, and/or multiple separately enclosed microelectronic devices, with some or all of the heat pipes rejecting their heat to a common externally-supplied and vented system of air ducts.

This arrangement is in contrast to conventional practices, wherein heat removed from the computer components devices is rejected within the enclosure (e.g., by fin/fan combinations mounted on the CPU, GPU, and controller chips), and fans are used to blow air through the enclosure, moving the heat out into the room housing the computer, heating up the air in the room. This arrangement often requires that the room housing the computer(s) be air conditioned, to prevent the air temperature from rising beyond acceptable limits. It has been calculated that the power requirements associated with the air-conditioning of the rooms housing the computers, e.g., for data centers, is comparable to the power consumed by the computers. Thus, by transferring the heat to externally-supplied and vented non-air-conditioned air, the overall power requirements for the computer system and its ancillary systems may be reduced by nearly half. In another embodiment, the external cooling may be provided by an inexpensive liquid coolant, e.g., cooling water, in lieu of air. In either case, the air or the liquid coolant may flow to a location outside of the room, thereby reducing the amount of heat added to the room environment.

Although the invention is illustrated and described herein with reference to specific embodiments, it is not intended that the subjoined claims be limited to the details shown. Rather, it is expected that various modifications may be made in these details by those skilled in the art, which modifications may still be within the spirit and scope of the claimed subject matter and it is intended that these claims be construed accordingly.

What is claimed is:

1. A microelectronics cooling system, comprising:
   a) a microchannel heat absorber including an outer heat transfer surface located proximate an outer heat transfer surface of a microelectronic device within an electronic device enclosure and comprising at least one layer defining a plurality of microchannels having a cross-sectional dimension of less than 1000 microns and terminating at a first end in a cool side manifold and at a second end in a warm side manifold, the microchannels adapted to contain a liquid working fluid that absorbs heat from the microelectronic device and forms a vapor upon flowing therethrough from the first end to the second end,
   b) a heat sink located outside of the enclosure for receiving and condensing the vapor to reform the liquid working fluid and for discharging the liquid working fluid, and
   c) at least one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber located proximate the heat transfer surface to the heat sink located outside of the enclosure and of the liquid working fluid from the heat sink located outside of the enclosure to the heat absorber when heat is applied to the heat absorber located proximate the heat transfer surface.

2. The microelectronics cooling system of claim 1, wherein the heat sink is installed outside of a room housing the electronic device enclosure.

3. The microelectronics cooling system of claim 1 wherein the heat sink is installed in a cooling duct that flows to a location outside of a room housing the electronic device enclosure, wherein a cooling medium flowing through the duct includes air or water.

4. The microelectronics cooling system of claim 1, wherein the one or more pipes comprises a first pipe flowably connecting the warm side manifold of the heat absorber to the heat sink and a second pipe flowably connecting the cool side manifold of the heat absorber to the heat sink.

5. The microelectronics cooling system of claim 1, wherein the one or more pipes comprises only a single pipe.

6. The microelectronics cooling system of claim 1, wherein the single pipe comprises a porous coaxial wick.

7. The microelectronics cooling system of claim 1, wherein the single pipe comprises an annular band of a porous wicking material.

8. The microelectronics cooling system of claim 1, wherein the heat sink is a microchannel heat sink.

9. The microelectronics cooling system of claim 1, wherein the microchannels are substantially rectangular channels, wherein the cross-sectional dimension of the microchannels is a shorter of two different cross-sectional dimensions for the microchannels, and wherein the shorter cross-sectional dimensions are aligned perpendicular to a surface of a heat source.

10. The microelectronics cooling system of claim 1, wherein the microchannel heat absorber is a parallel flow microchannel heat absorber.

11. The microelectronics cooling system of claim 1, wherein the microchannel heat absorber is a cross-flow microchannel heat absorber.

12. The microelectronics cooling system of claim 1, wherein the thermal conductivity of material in the layer that defines the microchannels is greater than 170 watts/m ° C. and the microchannels have a largest cross-sectional dimension of less than 250 microns.

13. The microelectronics cooling system of claim 1, wherein the cooling system is entirely passive.

14. The microelectronics cooling system of claim 1 further comprising at least one more microelectronic device and at least one more microchannel heat absorber, wherein the microchannel heat absorbers are connected via common manifolds to the heat sink.

15. A method of cooling a microelectronic device housed inside an enclosure, comprising:
 i) providing
  a) a microchannel heat absorber having an outer heat transfer surface and comprising at least one layer defining a plurality of microchannels having a cross-sectional dimension of less than 1000 microns and terminating at a first end thereof in a cool side manifold and at a second end thereof in a warm side manifold, the microchannels containing a liquid working fluid that absorbs heat and forms a vapor upon flowing therethrough from the first end to the second end,
  b) a heat sink for receiving and condensing the vapor to reform the liquid working fluid and for discharging the liquid working fluid, and
  c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber,
 ii) installing the microchannel heat absorber inside the enclosure with its outer heat transfer surface proximate an outer heat transfer surface of the microelectronic device, and
 iii) installing the heat sink outside the enclosure.

16. The microelectronics cooling method of claim 4, wherein the step of providing provides a heat sink that is installed outside of a room housing the electronic device enclosure or in a cooling duct that flows to a location outside of the room, and wherein the cooling medium flowing through the duct is air or water.

17. The microelectronics cooling method of claim 4, wherein the step of providing provides the layer that defines the microchannels with a thermal conductivity that is greater than 170 watts/m ° C. and the microchannels have a largest cross-sectional dimension of less than 250 microns.

18. The microelectronics cooling method of claim 4, wherein the step of providing provides an entirely passive microelectronics cooling system.

19. A method of cooling a microelectronic device housed inside an enclosure, comprising
 causing a liquid working fluid to flow through a plurality of microchannels in a microchannel heat absorber that includes an outer heat transfer surface proximate an outer heat transfer surface of the microelectronic device within a microelectronic device enclosure and having a cross-sectional dimension to the center of the channel that is equal to or less than the thermal boundary layer thickness for a working fluid,
 causing at least some of the working fluid to form a vapor and absorb heat from the microelectronic device,
 receiving and condensing the working fluid vapor from the microchannel heat absorber to discharge heat from the fluid outside the enclosure and reform the liquid working fluid, and
 continuously returning the condensed working fluid from outside of the enclosure back to the heat absorber in the enclosure.

20. The microelectronics cooling method of claim 19, wherein the step of causing the working fluid to form a vapor takes place in the microchannels.

21. The microelectronics cooling method of claim 19, wherein the step of condensing takes place in the microchannels.

22. The microelectronics cooling method of claim 19, wherein the working fluid is conveyed substantially only passively.

23. A microelectronics cooling system, comprising:
 means for absorbing heat from an outside surface of a microelectronic device in a microelectronic device enclosure through evaporation of a working fluid by a plurality of microchannels that are proximate the microelectronic device within the enclosure and having a cross-sectional dimension to the center of the channel that is about equal to or less than the thermal boundary layer thickness for a working fluid,
 means for receiving and condensing the working fluid vapor from the means for absorbing to discharge heat from the fluid outside the enclosure and reform the liquid working fluid, and
 means for continuously returning the condensed working fluid from outside of the enclosure back to the means for absorbing in the enclosure.

24. The microelectronics cooling system of claim 23, wherein the means for continuously returning the working fluid operates substantially only passively.

25. The microelectronics cooling method of claim 19 further including causing the liquid working fluid to flow through an additional plurality of microchannels that are proximate an additional microelectronic device within the microelectronic device enclosure and having a cross-sectional dimension to the center of the channel that is equal to or less than the thermal boundary layer thickness for a working fluid and causing at least some of the working fluid to form a vapor and absorb heat from the microelectronic device, and wherein the step of receiving and condensing the working fluid vapor also receives and condenses heat from the additional plurality of microchannels.

* * * * *